United States Patent [19]
Lux et al.

[11] Patent Number: 5,339,053
[45] Date of Patent: Aug. 16, 1994

[54] INSTANT-ON MICROWAVE OSCILLATORS USING RESONANT TUNNELING DIODE

[75] Inventors: Robert A. Lux, Toms River; Thomas E. Koscica, Clark; James F. Harvey, Tinton Falls, all of N.J.

[73] Assignee: The United States of America as represented by the Secretary of the Army, Washington, D.C.

[21] Appl. No.: 123,011

[22] Filed: Sep. 17, 1993

[51] Int. Cl.$^5$ .......................... H03B 7/08; H03B 7/14
[52] U.S. Cl. ............................. 331/99; 331/107 SL; 331/107 T
[58] Field of Search ......... 331/96, 99, 107 T, 107 S L

[56] References Cited

U.S. PATENT DOCUMENTS

| | | | |
|---|---|---|---|
| 4,831,340 | 5/1989 | Sollner | 331/76 X |
| 5,144,261 | 9/1992 | Harvey et al. | 331/107 T X |

OTHER PUBLICATIONS

Gering, J. A., et al., "A Small-Signal Equivalent-Circuit model for GaAs-Al$_x$Ga$_{1-x}$As Resonant Tunneling Heterostructures at Microwave Frequencies", J. Appl. Phys. 61(1), Jan. 1987, pp. 271-276.

Luryi, Serge, "Frequency Limit of Double-Barrier Resonant Tunneling Oscillators", Appl. Phys. Lett 47(5), Sep. 1, 1985 pp. 490-492.

Sollner, T. C. L. G., et al., "Microwave and Millimeter Wave Resonant Tunneling Devices", The Lincoln Laboratory Journal, vol. 1, No. 1, 1988, pp. 89-105.

Primary Examiner—Siegfried H. Grimm
Attorney, Agent, or Firm—Michael Zelenka; William H. Anderson

[57] ABSTRACT

A microwave oscillator capable of being switched into or out of the oscillating state within a fraction of the period of oscillation. The instant-on microwave oscillator permits both the generation and modulation of a microwave signal by using a single active microwave semiconductor device which is a resonant tunneling diode. The instant-on microwave oscillator circuit includes a conductive transmission line having an impedance $Z_O$ with a corresponding ground plane; and a pair of output terminals connected one on each of the transmission line and the ground plane. An impedance $Z_L$, having an impedance value which is less than ZO, is positioned across the output terminals. A pair of input terminals is connected at the opposite end of the transmission line, one on each of the transmission line and the ground plane with a resonant tunneling diode connected across the input terminals. An impedance Z is connected to the input terminal on the biased side of the transmission line. Means are provided for applying a square wave shaped switched power supply signal to the resonant tunneling diode through impedance Z. Means are also provided for separating the square wave and oscillation signals at the output terminals.

21 Claims, 3 Drawing Sheets

INSTANT-ON MICROWAVE OSCILLATORS USING RESONANT TUNNELING DIODE

GOVERNMENT INTEREST

The invention described herein may be manufactured, used and licensed by or for the Government of the United States without the payment to us of any royalty thereon.

FIELD OF THE INVENTION

This invention relates to the field of microwave signal sources. More particularly, the invention pertains to the field of microwave oscillators and still more particularly to instant-on microwave oscillators using resonant tunneling diodes.

1. Background of the Invention

The invention provides a microwave oscillator capable of being switched into or out of the oscillating state within a fraction of the period of oscillation by using a resonant tunneling diode negative resistance device. The oscillator has been found to be useful for such applications as a pulse generator in microwave systems since a resonant tunneling diode can respond to electrical impulses in picosecond or subpicosecond times. The mechanism is a fast nonlinear process which insures no transient time effects even at the highest microwave frequencies. The instant-on microwave oscillator permits both the generation and modulation of a microwave signal by using a single active microwave semiconductor device, namely the resonant tunneling diode. The use of a resonant tunneling device achieves high microwave functional density which results in a small and minimum component microwave pulse generator.

2. Description of the Prior Art

Microwave pulse sources conventionally use a continuously on oscillator with a separate modulator or switch component to generate the pulse stream. A significant problem with this method is that power is continuously used even when no pulse is being generated at the output. The present invention permits a considerable savings of consumed power compared with the conventional approach since a resonant tunneling diode is kept in the fully off state until the microwave pulse is actually needed. Thus power is only consumed during the actual duty cycle of the microwave pulse. An additional benefit is a reduced component count. No separate modulator or switching component is needed since the resonant tunneling diode performs both RF generation and modulation. The invention provides a device capable of turning on an oscillator to its full amplitude in the first half cycle without the need for any transient ramp on delay, as is needed with traditional methods which rely on a linear resonator element since the natural quality factor or Q is >1 and demands a transient due to physics of operation. The present oscillator can be powered off between each pulse. Traditional oscillators are kept continuously on to avoid the ramp up/start up delay with a separate device used for pulse modulation of the RF signal from the oscillator. The invention is fully powered off between pulses thus minimizing supply power consumed. The invention also uses only a single element, the resonant tunneling diode, for both RF power generation and RF pulse modulation control. Prior art pulse forming techniques use separate RF devices for generation and for modulation. The present invention is thus functionally dense and requires fewer RF components to perform a pulse forming function.

SUMMARY OF THE INVENTION

The invention provides an instant-on microwave oscillator circuit which includes a conductive transmission line having an impedance $Z_O$; a ground plane corresponding to that transmission line; and a pair of output terminals connected one on each of the transmission line and the corresponding ground plane. An impedance $Z_L$, having an impedance value which is less than $Z_O$, is positioned between the output terminals. A pair of input terminals is connected, one on each of the transmission line and the ground plane, with a resonant tunneling diode connected across the input terminals. An impedance Z is connected to the input terminal on the transmission line. Means are provided for applying a square wave shaped switched power supply signal to the resonant tunneling diode through impedance Z. Means are also provided for separating the square wave and oscillation signals at the output terminals.

The invention also provides a method for generating microwave signals by providing an instant-on microwave oscillator circuit which includes a conductive transmission line having an impedance $Z_O$; a ground plane; and a pair of output terminals connected one on each of the transmission line and the ground plane. An impedance $Z_L$, having an impedance value which is less than $Z_O$, is positioned between the output terminals. A pair of input terminals is connected, one on each of the transmission line and the ground plane, with a resonant tunneling diode connected across the input terminals. An impedance Z is connected to the input terminal on the transmission line. A square wave shaped switched power supply signal is applied to the resonant tunneling diode through impedance Z. The carrier square wave and output oscillation signals at the output terminals are then separated.

BRIEF DESCRIPTION OF THE DRAWINGS

These and other objects, features, and details of the invention will become apparent in light of the ensuing detailed disclosure and particularly in light of the drawings wherein.

DETAILED DESCRIPTION OF THE PREFERRED EMBODIMENT

Figure 1:
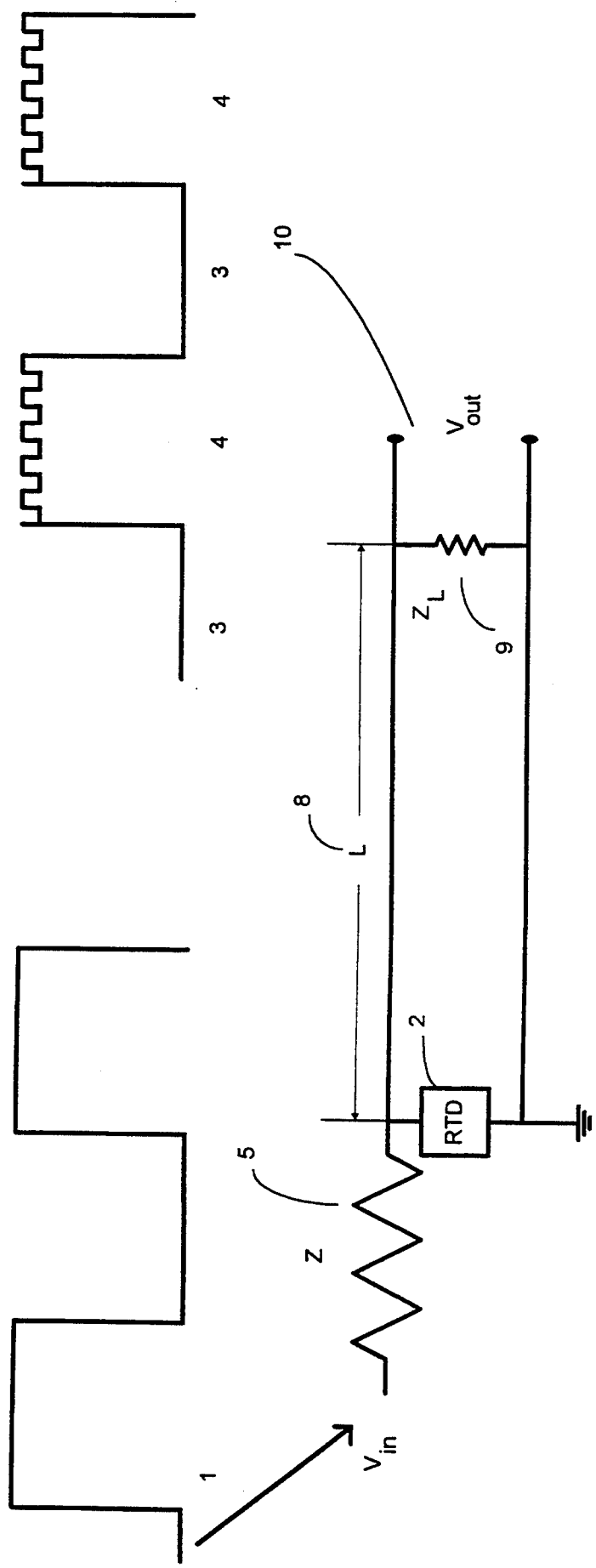
FIG. 1 is a schematic view of the instant-on microwave oscillator of the invention.

Referring to FIG. 1, there is shown a square wave shaped switched source 1 which acts as a switched power source and is applied onto the resonant tunneling diode 2, through an impedance component Z located at 5. In the preferred embodiment, Z is a resistive component having an impedance greater than the resonant tunneling diode 2 and transmission line 8. This component 5 limits current into the resonant tunneling diode and keeps the microwave signal generated at the resonant tunneling diode from entering the square wave power source. Preferably Z has an impedance of at least about 100 ohms and more preferably ranges from about 100 ohms to about 200 ohms. The square wave source generates an input signal at a low frequency switching rate which is about 100 megahertz or less. Oscillation signals generated on the resonant tunneling diode travel down the transmission line 8, having length L, until reaching a load impedance $Z_L$ 9. At $Z_L$, the output signal 10 is connected to external circuitry or external filters to separate the square wave and oscillation signals. The output signal consists of two regions as shown in FIG. 1. Regions 3 contain no oscillation signal whereas regions 4 do contain a superimposed oscillation signal on the square wave carrier. The output signal can be designed to range from about 100 megahertz to about 30 gigahertz with proper choice of length L at 8, although the frequencies can be higher or lower with proper sizing.

Figure 2:
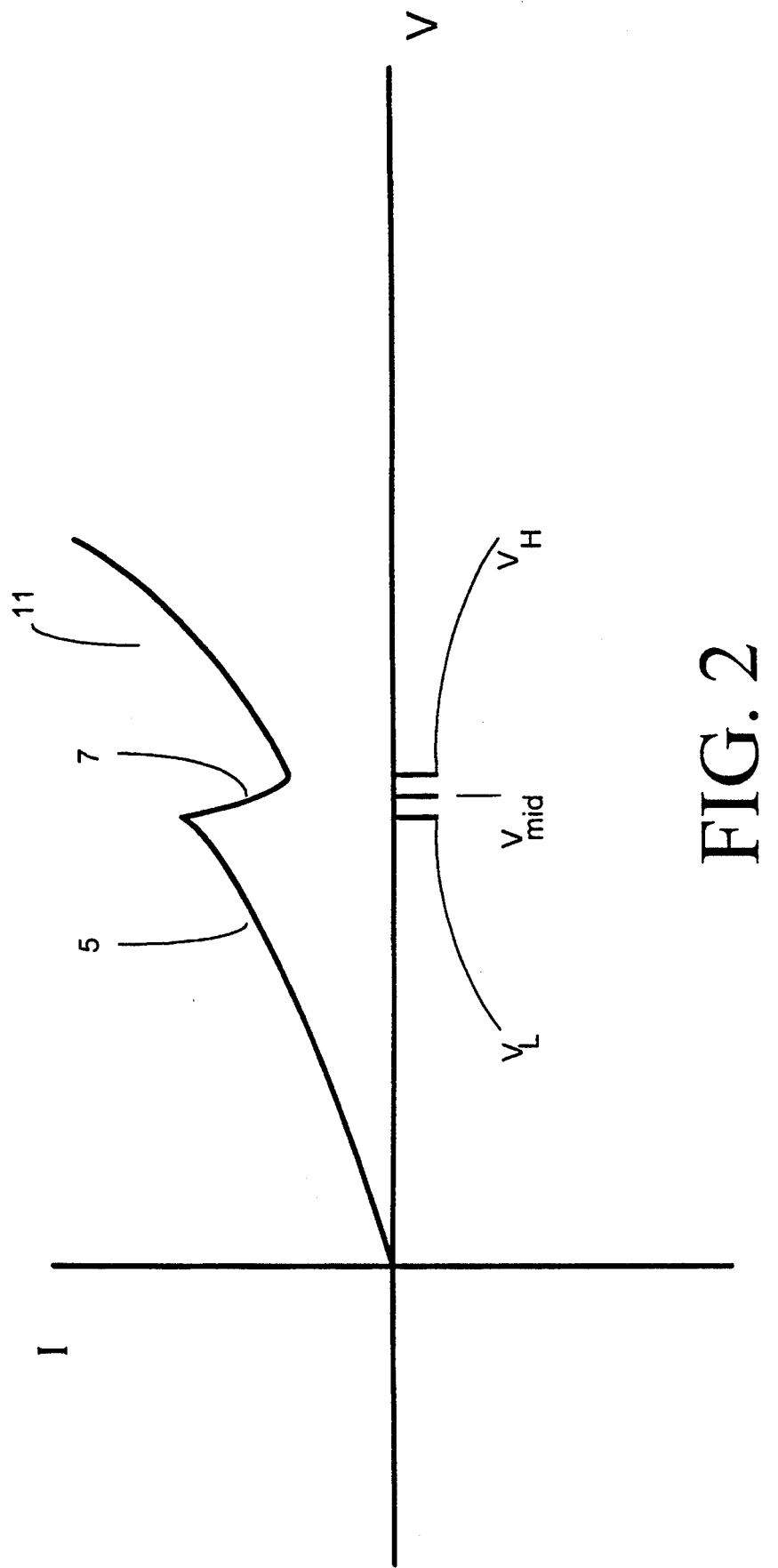
FIG. 2 is a graph of voltage vs. current in the resonant tunneling diode used in the invention.

A resonant tunneling diode is a device which depends on quantum mechanical effects. These effects lead to a terminal current voltage characteristic as shown in FIG. 2. It consists of a distinct and separate positive resistance region 6 and a negative resistance region 7. A second positive resistance region 11 is located at voltages higher than region 7 of FIG. 2.

Figure 3:
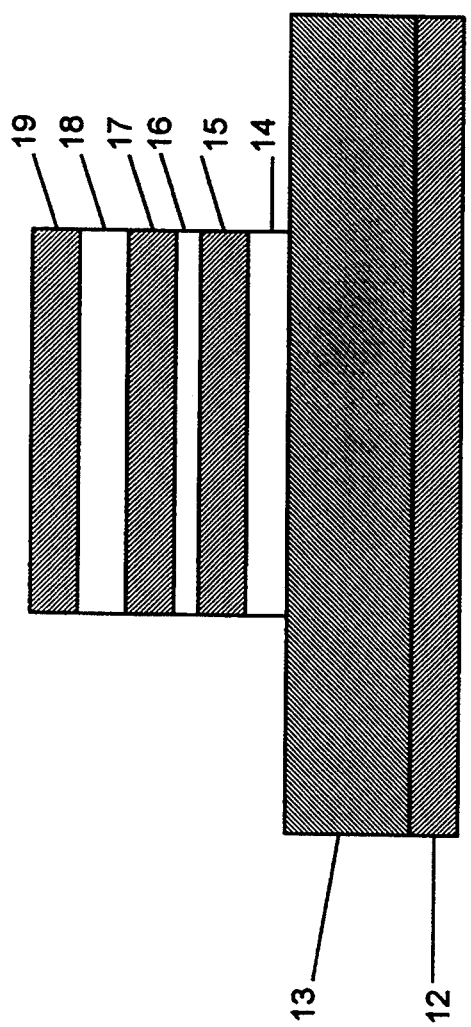
FIG. 3 is a schematic view of a resonant tunneling diode useful for the invention.

Resonant tunneling diode oscillators can be fabricated from a host of different semiconductor materials, but only diodes using a superlattice grown on gallium arsenide or indium phosphide are used at microwave frequencies. The construction of a typical negative resistance resonant tunneling diode is shown in FIG. 3. It comprises an ohmic contact 12 and a GaAs substrate 13. Sequentially formed on the GaAs substrate 13 is a heterostructure formed by epitaxially growing a superlattice and lithographically imaging and etching it to the desired configuration. The typical heterostructure comprises GaAs portion 14, $Al_xGa_{1-x}As$ segment 15, a GaAs portion 16, $Al_xGa_{1-x}As$ segment 17, GaAs section 18 and ohmic contact 19. The GaAs section 16 is thin and has a thickness of about 2 to 10 nm. It is sandwiched between the two thin (1 to 5 nm thick) layers of $Al_xGa_{1-x}As$, namely 15 and 17 which raises the band-gap above that of GaAs so that the $Al_xGa_{1-x}As$ regions act as partially transparent mirrors to electrons. The higher energy level of these barriers reflects the electrons back to the region of the structure from which they came. The charge transport across the structure takes place by tunneling through the thin $Al_xGa_{1-x}As$ barriers. The transmission probability of electrons tunneling through the structure is highly peaked at the resonant state energy. At resonance, the current through the device is at a maximum. Applying a forward bias voltage beyond this point gives rise to a negative differential resistance and tunneling current will flow until thermionic currents over the barrier mask out the tunneling currents through the barriers. This point is shown as $V_H$ in FIG. 2. At this location tunneling is no longer possible and corresponds to the current minimum at the end of the negative resistance region. The negative resistance is produced by the tunneling of electrons across a junction that has a high potential barrier. Small capacitance and the rapidity with which tunneling takes place account for the excellent high frequency response of the resonant tunneling diode.

In operation, the square wave shaped signal source controls the state of operation of the resonant tunneling diode. When the resonant tunneling diode has a low or near zero voltage ($V_{supply}=0$) applied to it by the switched source, it is in its positive resistance region, or positive slope region, as seen by referring to FIG. 2. During this state no oscillation can occur. When the resonant tunneling diode has a voltage applied to it such that it is biased into the negative resistance region of FIG. 2 with the preferred value at $V_{mid}$ ($V_{supply}=V_{mid}$), it is immediately forced to the value $V_L$ on the edge of the positive resistance region 6 due to the negative resistance caused by the negative slope. Next the voltage difference signal induced by the negative resistance, namely, $V_L$-$V_{mid}$, is superimposed on the supply signal ($V_{supply}=V_{mid}$), and propagates down the transmission line with an impedance of $Z_o$. In the preferred embodiment, a $Z_o$ value ranges from about 40 ohms to about 100 ohms but is preferably about 50 ohms. Upon reaching $Z_L$, a reflection wave is set up which is smaller in amplitude but reversed in phase so that it is slightly larger than ($V_{supply}=V_{mid}$). Phase reversal means that the RF signal superimposed on ($V_{supply}=V_{mid}$), reverses in sign. This reflection wave again traverses the transmission line such that upon reaching the resonant tunneling diode it is forced to the value $V_H$ by the negative resistance. $Z_L$ can range from about 10 ohms or less and up to about 50 ohms, but must be an impedance less than $Z_o$ for proper operation of the present invention. A preferred impedance is low or nearer to about 10 ohms. It is preferably a capacitive element. Alternatively $Z_L$ may be a resistive component, but this embodiment is less preferred due to excess DC and RF power dissipation.

The resonant tunneling diode clamps the signal to either $V_L$ or $V_H$ depending on the phase of the reflected wavefronts incident on it from the load $Z_L$ which provides the phase reversals needed for oscillations to occur. Since an oscillation is traditionally a full cycle, two phase reversals or path traversals are needed for every cycle. The signal travels to a total length of 4L each electrical cycle of oscillation. The conductive transmission line L has a length of one-quarter of the wavelength of the oscillation signal at the output terminals. It preferably has a length of from about 0.1 mm to about 1 meter and more preferably from about 1 mm to about 20 mm. This relationship is used to set the operation frequency of the instant on oscillator. Since the instant on oscillator depends on the general shape of the current vs. voltage characteristic shown in FIG. 2, it is obvious that any device that can be fabricated to have a similar current voltage curve with distinct positive and negative resistance regions can be used in the present circuit configuration in place of the resonant tunneling diode. The combination of the conductive transmission line and the ground plane together form a member which can be a coplanar line, a microstrip, a waveguide or a coaxial line. The two conductors need to have uniform or near uniform impedance along their length. It is within the contemplation of the invention that any of a number of two terminal negative resistance components can be used in place of the resonant tunneling diode. Such non-exclusively include a Gunn device, an IMPATT device or others that are known to those skilled in the art or fabricated with similar electrical properties.

It is to be understood that other features and modifications to the foregoing detailed description are within the contemplation of the invention which is not limited thereby.

What is claimed is:

1. An instant-on microwave oscillator circuit comprising a conductive transmission line having an impedance $Z_O$; a ground plane; a pair of output terminals connected one on each of said transmission line and said ground plane and an impedance $Z_L$ between said output terminals and having an impedance value which is less than $Z_O$; a pair of input terminals connected one on each of said transmission line and said ground plane and a resonant tunneling diode connected between said input terminals; an impedance Z connected to the input terminal on said transmission line; means for applying a square wave shaped switched power supply signal to the resonant tunneling diode through impedance Z; and means for separating the square wave and the output oscillation signals at said output terminals.

2. The instant-on microwave oscillator circuit of claim 1 wherein the means for applying a square wave shaped switched power supply signal generates an input signal at a switching rate which is about 100 megahertz or less.

3. The instant-on microwave oscillator circuit of claim 1 wherein the output oscillation signal ranges from about 100 megahertz to about 30 gigahertz.

4. The instant-on microwave oscillator circuit of claim 1 wherein $Z_O$ ranges from about 40 ohms to about 100 ohms.

5. The instant-on microwave oscillator circuit of claim 1 wherein $Z_L$ ranges from about 10 ohms to about 50 ohms.

6. The instant-on microwave oscillator circuit of claim 1 wherein Z is at least about 100 ohms.

7. The instant-on microwave oscillator circuit of claim 1 wherein Z ranges from about 100 ohms to about 200 ohms.

8. The instant-on microwave oscillator circuit of claim 1 wherein the conductive transmission line has a length of one-quarter of the wavelength of the RF oscillation signal at said output terminals.

9. The instant-on microwave oscillator circuit of claim 1 wherein the conductive transmission line has a length of from about 0.1 mm to about 1 meter.

10. The instant-on microwave oscillator circuit of claim 1 wherein the conductive transmission line has a length of from about 1 mm to about 20 mm.

11. The instant-on microwave oscillator circuit of claim 1 wherein the means for separating the square wave and output oscillation signals at said output terminals comprises a filter.

12. The instant-on microwave oscillator circuit of claim 1 wherein the combination of the conductive transmission line and the ground plane comprise a member selected from the group consisting of a coplanar line, a microstrip, a waveguide and a coaxial line.

13. The instant-on microwave oscillator circuit of claim 1 wherein $Z_L$ is a capacitor.

14. A method for generating microwave signals which comprises a.) providing an instant-on microwave oscillator circuit comprising a conductive transmission line having an impedance $Z_O$; a ground plane; a pair of output terminals connected one on each of said transmission line and said ground plane and an impedance $Z_L$ between said output terminals and having an impedance value which is less than $Z_O$; a pair of input terminals connected one on each of said transmission line and said ground plane and a resonant tunneling diode connected between said input terminals; an impedance Z connected to the input terminal on said transmission line; means for applying a square wave shaped switched power supply signal to the resonant tunneling diode through impedance Z; and means for separating the square wave and output oscillation signals at said output terminals; and b.) applying a square wave shaped switched power supply signal to the resonant tunneling diode through impedance Z; and c.) separating the square wave and output oscillation signals at said output terminals.

15. The method of claim 14 wherein the output oscillation signal ranges from about 100 megahertz to about 30 gigahertz.

16. The method of claim 14 wherein the a square wave shaped switched power supply signal generates an input signal at a switching rate which is about 100 megahertz or less.

17. The method of claim 14 wherein $Z_O$ ranges from about 40 ohms to about 100 ohms; and $Z_L$ ranges from about 10 ohms to about 50 ohms; and Z is at least about 100 ohms.

18. The method of claim 17 wherein Z ranges from about 100 ohms to about 200 ohms.

19. The method of claim 14 wherein the conductive transmission line has a length of one-quarter of the wavelength of the oscillation signal at said output terminals.

20. The method of claim 14 wherein the conductive transmission line has a length of from about 0.1 mm to about 1 meter.

21. The method of claim 14 wherein $Z_O$ ranges from about 40 ohms to about 100 ohms; wherein $Z_L$ ranges from about 10 ohms to about 50 ohms; wherein Z ranges from about 100 ohms to about 200 ohms; and wherein the conductive transmission line has a length of from about 1 mm to about 20 mm.

* * * * *